US007859835B2

(12) United States Patent
Puzella et al.

(10) Patent No.: US 7,859,835 B2
(45) Date of Patent: Dec. 28, 2010

(54) METHOD AND APPARATUS FOR THERMAL MANAGEMENT OF A RADIO FREQUENCY SYSTEM

(75) Inventors: Angelo M. Puzella, Marlborough, MA (US); Joseph A. Licciardello, Hudson, NH (US); Stephen J. Pereira, Hopedale, MA (US); Joseph R. Ellsworth, Worcester, MA (US)

(73) Assignee: Allegro Microsystems, Inc., Worcester, MA (US)

(*) Notice: Subject to any disclaimer, the term of this patent is extended or adjusted under 35 U.S.C. 154(b) by 85 days.

(21) Appl. No.: 12/482,061

(22) Filed: Jun. 10, 2009

(65) Prior Publication Data

US 2010/0245179 A1 Sep. 30, 2010

Related U.S. Application Data

(60) Provisional application No. 61/162,798, filed on Mar. 24, 2009.

(51) Int. Cl.
*H05K 7/20* (2006.01)
*H01Q 1/22* (2006.01)
*F28D 21/00* (2006.01)

(52) U.S. Cl. .......................... 361/679.49; 361/679.47; 361/679.5; 361/696; 361/697; 165/121; 165/122; 165/104.33; 165/185; 343/700 MS; 343/702; 343/720; 343/853

(58) Field of Classification Search ...... 361/679.46–54, 361/690–697, 702–712, 715–727; 165/80.3, 165/80.4, 80.5, 104.33, 104.34, 121–126, 165/185; 342/368, 371, 372; 174/16.3, 252, 174/260; 343/700 MS, 702, 705, 720, 725, 343/850–858, 860–867, 767, 770, 776, 777, 343/893, 872, 904, 906; 454/184
See application file for complete search history.

(56) References Cited

U.S. PATENT DOCUMENTS 3,091,743 A 5/1963 Wilkinson (Continued)

FOREIGN PATENT DOCUMENTS

EP 0 481 417 A 4/1992

(Continued)

OTHER PUBLICATIONS

Bash et al.; "Improving Heat Transfer From a Flip-Chip Package;" Technology Industry; Email Alert RSS Feed; Hewlett-Packard Journal, Aug. 1997; 3 pages.

(Continued)

*Primary Examiner*—Michael V Datskovskiy
(74) *Attorney, Agent, or Firm*—Daly, Crowley, Mofford & Durkee, LLP

(57) ABSTRACT

A thermal management system includes an air duct assembly comprising a supply air duct having an air inlet opening, a return air duct having an air exit opening and a plurality of distribution air ducts configured to be in fluid communication with the air inlet opening of the supply air duct and with the air exit opening of the return air duct. A fan is disposed within the air duct assembly to direct air from the air inlet opening of the supply air duct through the supply air duct and out the air exit opening of the return air duct. The fan and supply duct are disposed to direct air over a first surface of a heat sink. A second opposing surface of the heat sink is disposed over and configured to be in thermal contact with a plurality of active circuits disposed on a first surface of a radio frequency (RF) multi-layer printing wiring board (PWB).

34 Claims, 12 Drawing Sheets

U.S. PATENT DOCUMENTS

| | | | |
|---|---|---|---|
| 3,665,480 A | | 5/1972 | Fassett |
| 4,489,363 A | * | 12/1984 | Goldberg ..................... 361/693 |
| 4,527,165 A | | 7/1985 | deRonde |
| 4,706,094 A | | 11/1987 | Kubick |
| 4,751,513 A | | 6/1988 | Daryoush et al. |
| 4,835,658 A | * | 5/1989 | Bonnefoy ..................... 361/692 |
| 5,005,019 A | | 4/1991 | Zaghloul et al. |
| 5,055,852 A | | 10/1991 | Dusseux et al. |
| 5,099,254 A | * | 3/1992 | Tsukii et al. ................. 343/853 |
| 5,276,455 A | | 1/1994 | Fitzsimmons et al. |
| 5,398,010 A | | 3/1995 | Klebe |
| 5,400,040 A | | 3/1995 | Lane et al. |
| 5,404,148 A | | 4/1995 | Zwarts |
| 5,451,969 A | | 9/1995 | Toth et al. |
| 5,459,474 A | | 10/1995 | Mattioli et al. |
| 5,488,380 A | | 1/1996 | Harvey et al. |
| 5,493,305 A | | 2/1996 | Wooldridge et al. |
| 5,563,613 A | | 10/1996 | Schroeder et al. |
| 5,592,363 A | * | 1/1997 | Atarashi et al. ............. 361/689 |
| 5,675,345 A | | 10/1997 | Pozgay et al. |
| 5,724,048 A | | 3/1998 | Remondiere |
| 5,786,792 A | | 7/1998 | Bellus et al. |
| 5,854,607 A | * | 12/1998 | Kinghorn ..................... 343/853 |
| 5,907,304 A | | 5/1999 | Wilson et al. |
| 6,011,507 A | | 1/2000 | Curran et al. |
| 6,037,903 A | | 3/2000 | Lange et al. |
| 6,061,027 A | | 5/2000 | Legay et al. |
| 6,078,289 A | | 6/2000 | Manoogian et al. |
| 6,087,988 A | | 7/2000 | Pozgay |
| 6,091,373 A | | 7/2000 | Raguenet |
| 6,104,343 A | | 8/2000 | Brookner et al. |
| 6,127,985 A | | 10/2000 | Guler |
| 6,166,705 A | | 12/2000 | Mast et al. |
| 6,181,280 B1 | | 1/2001 | Kadambi et al. |
| 6,184,832 B1 | | 2/2001 | Geyh et al. |
| 6,208,316 B1 | | 3/2001 | Cahill |
| 6,211,824 B1 | | 4/2001 | Holden et al. |
| 6,218,214 B1 | | 4/2001 | Panchou et al. |
| 6,222,493 B1 | | 4/2001 | Caille et al. |
| 6,225,695 B1 | | 5/2001 | Chia et al. |
| 6,297,775 B1 | | 10/2001 | Haws et al. |
| 6,388,620 B1 | | 5/2002 | Bhattacharyya |
| 6,424,313 B1 | | 7/2002 | Navarro et al. |
| 6,480,167 B2 | | 11/2002 | Matthews |
| 6,483,705 B2 | | 11/2002 | Snyder et al. |
| 6,611,180 B1 | | 8/2003 | Puzella et al. |
| 6,621,470 B1 | | 9/2003 | Boeringer et al. |
| 6,624,787 B2 | | 9/2003 | Puzella et al. |
| 6,661,376 B2 | | 12/2003 | Maceo et al. |
| 6,670,930 B2 | | 12/2003 | Navarro |
| 6,686,885 B1 | | 2/2004 | Barkdoll et al. |
| 6,703,976 B2 | | 3/2004 | Jacomb-Hood et al. |
| 6,731,189 B2 | | 5/2004 | Puzella et al. |
| 6,756,684 B2 | | 6/2004 | Huang |
| 6,856,210 B2 | | 2/2005 | Zhu et al. |
| 6,900,765 B2 | | 5/2005 | Navarro et al. |
| 6,943,330 B2 | | 9/2005 | Ring |
| 6,961,248 B2 | * | 11/2005 | Vincent et al. ............. 361/796 |
| 6,995,322 B2 | | 2/2006 | Chan et al. |
| 7,030,712 B2 | | 4/2006 | Brunette et al. |
| 7,061,446 B1 | | 6/2006 | Short, Jr. et al. |
| 7,129,908 B2 | * | 10/2006 | Edward et al. ............. 343/878 |
| 7,132,990 B2 | | 11/2006 | Stenger et al. |
| 7,180,745 B2 | | 2/2007 | Mandel et al. |
| 7,187,342 B2 | | 3/2007 | Heisen et al. |
| 7,417,598 B2 | | 8/2008 | Navarro et al. |
| 7,443,354 B2 | * | 10/2008 | Navarro et al. ............. 343/777 |
| 7,444,737 B2 | | 11/2008 | Worl |
| 7,489,283 B2 | | 2/2009 | Ingram et al. |
| 7,508,338 B2 | * | 3/2009 | Pluymers et al. ............. 342/175 |
| 7,597,534 B2 | * | 10/2009 | Hopkins ..................... 415/119 |
| 2005/0110681 A1 | | 5/2005 | Londre |
| 2005/0151215 A1 | | 7/2005 | Hauhe et al. |
| 2006/0268518 A1 | * | 11/2006 | Edward et al. ............. 361/695 |
| 2007/0152882 A1 | | 7/2007 | Hash et al. |
| 2008/0074324 A1 | | 3/2008 | Puzella et al. |
| 2008/0106467 A1 | | 5/2008 | Navarro et al. |
| 2008/0106482 A1 | | 5/2008 | Cherrette et al. |
| 2008/0150832 A1 | | 6/2008 | Ingram et al. |
| 2008/0316139 A1 | | 12/2008 | Blaser et al. |

FOREIGN PATENT DOCUMENTS

| | | | |
|---|---|---|---|
| EP | 1 764 863 A1 | | 3/2007 |
| EP | 1 436 859 B1 | | 8/2007 |
| JP | 4-122107 A | | 4/1992 |
| JP | 06-097710 | | 4/1994 |
| JP | 7-212125 | | 8/1995 |
| JP | 2000-138525 A | | 5/2000 |
| JP | 02003179429 A | * | 6/2003 |
| JP | 2005 505963 | | 2/2005 |
| KR | 1020010079872 A | | 8/2001 |
| WO | WO 98/26642 | | 6/1998 |
| WO | WO 99/66594 | | 12/1999 |
| WO | WO 01/20720 A1 | | 3/2001 |
| WO | WO 01/41257 A1 | | 6/2001 |
| WO | WO 03/003031 A1 | | 4/2003 |
| WO | WO 2007/136941 A2 | | 11/2007 |
| WO | WO 2007/136941 A3 | | 11/2007 |
| WO | WO 2008/010851 A2 | | 1/2008 |
| WO | WO 2008/010851 A3 | | 1/2008 |
| WO | WO 2008/036469 A1 | | 3/2008 |

OTHER PUBLICATIONS

Marsh et al.; "5.4 Watt GaAs MESFET MMIC for Phased Array Radar Systems;" 1997 Workshop on High Performance Electron Devices for Microwave and Optoelectronic Applications, Nov. 24-25, 1997; pp. 169-174.

Div. Application (with translation of amended claims) as filed on Dec. 1, 2008 and assigned App. No. 10-2008-7029396.

Decision of Rejection dated Jul. 30, 2008 from KR Pat. App. No. 10-2004-7003900.

Notice of Trial Decision dated Mar. 23, 2010 from KR Pat. App. No. 10-2004-7003900.

EP Search Report for 06021905.2; dated Feb. 9, 2007; 8 pages.

European Office Action dated Nov. 3, 2005 from EP Pat. App. No. 02800372.1.

Response to European Office Action filed Jan. 12, 2007 from EP Pat. App. No. 02800372.1.

European Office Action dated Oct. 18, 2007 from EPO Pat. App. No. 06021905.2.

Response to European Office Action dated Oct. 18, 2007 filed in the EPO on Aug. 11, 2008 from EP Pat. App. No. 06021905.2.

Response to European Office Action dated Mar. 19, 2009 filed in the EPO on Nov. 19, 2009 from EP Pat. App. No. 06021905.2.

European Office Action dated Feb. 18, 2010 from EPO Pat. App. No. 06021905.2.

Notice of Allowance dated Feb. 2, 2007 from EP Pat. App. No. 02800372.1.

Korean Office Action dated Oct. 31, 2007 from KR Pat. App. No. 10-2004-7003900.

Response to Korean Office Action filed Mar. 26, 2008 from KR Pat. App. No. 10-2004-7003900.

Korean Office Action dated Feb. 25, 2009 from KR Pat. App. No. 10-2008-7029396.

Korean Office Action dated Nov. 27, 2009 from KR Pat. App. No. 10-2008-7029396.

Japanese Office Action dated Mar. 7, 2007 from JP Pat. App. No. 2003-533378.

Japanese Office Action dated Feb. 15, 2008 from JP Pat. App. No. 2003-533378.

Japanese Office Action dated Feb. 18, 2009 from JP Pat. App. No. 2003-533378.

Response to Japanese Office Action filed Jul. 5, 2007 from JP App. No. 2003-533378.
Response to Japanese Office Action filed Jun. 19, 2009 from App JP App. No. 2003-533378.
PCT Search Report of the ISA for PCT/US2010/026861 dated Jun. 18, 2010; 6 pages.
PCT Written Opinion of the ISA for PCT/US2010/026861 dated Jun. 18, 2010; 5 pages.
Office Action dated Jun. 11, 2010 from U.S. Appl. No. 12/694,450.
Response to Office Action of Jun. 11, 2010 from U.S. Appl. No. 12/694,450 dated Sep. 21, 2010.
"S-band Modular Integrated Panel (S-MIP) Radar;" Proposal White Paper; copyright 2007 Raytheon Company; 17 pages.
Carter; "'Fuzz Button' interconnects and microwave and mm-wave frequencies;" IEEE Seminar, London, UK; Mar. 1-7, 2000; 7 pages.
Jerinic et al.; "X-Band "Tile" Array for Mobil Radar;" internal Raytheon Company publication; Spring 2003; 4 pages.
Puzella et al.; "Digital Subarray for Large Apertures;" slide presentation; internal Raytheon Company publication; Spring 2003; pp. 1-22.
Puzella et al.; "Radio Frequency Interconnect Circuits and Techniques;" U.S. Appl. No. 11/558,126, filed Nov. 9, 2006; 57 pages.
Puzella et al.; "X-Band Tile Sub-Array;" slide presentation; internal Raytheon Company publication; Spring 2003; 28 pages.
Puzella; "Deliverable Demonstration Sub-Array;" slide presentation; internal Raytheon Company publication; Fall 2003; pp. 1-17.
PCT International Preliminary Examination Report and Written Opinion of the ISA for PCT/US2002/30677 dated Nov. 27, 2003; 10 pages.
PCT International Preliminary Examination Report and Written Opinion of the ISA for PCT/US2007/074795 dated Apr. 2, 2009; 7pages.
PCT Search Report of the ISA for PCT/US2007/074795 dated Dec. 19, 2007; 5 pages.
PCT Written Opinion of the ISA for PCT/US2007/074795 dated Dec. 19, 2007; 5 pages.

* cited by examiner

METHOD AND APPARATUS FOR THERMAL MANAGEMENT OF A RADIO FREQUENCY SYSTEM

RELATED APPLICATIONS

This application claims the benefit under 35 U.S.C. §119(e) of provisional application No. 61/162,798 filed on Mar. 24, 2009 which application is incorporated herein by reference in its entirety.

FIELD OF THE INVENTION

The structures and techniques described herein relate to thermal management of radio frequency (RF) systems and more particularly to cooling RF phased arrays.

BACKGROUND OF THE INVENTION

As is known in the art, a phased array antenna includes a plurality of antenna elements spaced apart from each other by known distances. Each of the antenna elements are coupled through a plurality of phase shifter circuits, amplifier circuits and/or other circuits to either or both of a transmitter or receiver. In some cases, the phase shifter, amplifier circuits and other circuits (e.g. mixer circuits) are provided in a so-called transmit/receive (T/R) module and are considered to be part of the transmitter and/or receiver.

The phase shifters, amplifier and other circuits (e.g. T/R modules) often require an external power supply (e.g. a DC power supply) to operate correctly. Thus, the circuits are referred to as "active circuits" or "active components." Accordingly, phased array antennas which include active circuits are often referred to as "active phased arrays."

Active circuits dissipate power in the form of heat. Thus, active phased arrays must be cooled.

In active phased arrays having T/R channels which use relatively little power (i.e. less than two Watts (W) average RF power), individual finned heat-sinks (or "hat-sinks") are attached to each active circuit. That is, each active circuit has an individual heat sink attached thereto. Although this approach may satisfy the cooling requirements for the active phased array, this thermal management system is expensive since the cost of disposing a "hat-sink" on an active circuit is on the same order as the cost of the active circuit itself.

Furthermore, active phased arrays having an aperture size greater than about one square meter ($m^2$), typically operate at relatively high power levels (i.e. greater than two Watts average RF power). In this case, large capacity blowers are required to force air across the hat sinks. The use of such large capacity blowers results in the need for a relatively complicated air supply and return manifold and also causes high levels of backpressure across the phased array. Thus, the hat sink approach to air-cooling such active phased arrays is relatively difficult to implement and is also difficult to scale up to apertures greater than one square meter.

If large blowers are not used in relatively high power per T/R channel applications, it is often necessary to use a liquid cooling approach to maintain active circuits in their normal operating temperature range. Although the liquid cooling approach is effective to maintain active circuits at temperatures at or below maximum allowed operating temperatures, liquid cooling has very high life cycle costs. For example, liquid cooling requires the use of a manifold through which the liquid circulates. Such liquid filled manifolds add a tremendous amount of weight and complexity to a radar system which increases the radar system recurring cost and also increases the transportation costs and maintenance costs over the operational life of the active phased array.

It would therefore, be desirable to provide a reliable and cost effective technique for cooling RF systems which operate over a wide range of RF output power levels. It would also be desirable to provide a reliable and cost effective system and technique for cooling active phased arrays which operate over a wide range of RF output power levels.

SUMMARY OF THE INVENTION

In accordance with the systems and techniques described herein, a thermal management system includes an air duct assembly comprising a supply air duct having an air inlet opening, a return air duct having an air exit opening and a plurality of distribution air ducts configured to be in fluid communication with the air inlet opening of the supply air duct and with the air exit opening of the return air duct. The thermal management system further includes a fan disposed within the air duct assembly to direct air from the air inlet opening of the supply air duct through the supply air duct and out the air exit opening of the return air duct. The fan and supply duct are disposed to direct air over a first surface of a heat sink having heat spreading elements projecting therefrom. A second opposing surface of the heat sink is disposed over and configured to be in thermal contact with a plurality of active circuits disposed on a first surface of a radio frequency (RF) multi-layer printing wiring board (PWB). A second opposing surface of the active panel is configured to electrically couple to at least a portion of an antenna panel.

With this particular arrangement, a thermal management system suitable for air cooling an RF PWB having a plurality of active circuits (e.g. T/R channels) provided as part thereof is provided. In one embodiment, the RF PWB is provided as an active panel (i.e. a multi-layer radio frequency (RF) printed wiring board (PWB) having active circuits which generate heat provided as part thereof) of an active phased array. Thus, the thermal management system provides an approach for air-cooling an active panel suitable for use in an active, electronically scanned array (AESA) is provided. In one embodiment, the active circuits are mounted on an external surface of the PWB using a flip chip mounting technique. Coupling a heat sink directly to the flip chip mounted circuits disposed on the surface of the active panel (PWB) reduces the number of interfaces between the heat sink and the flip chip circuits and thus reduces the thermal resistances between heat generating portions of the flip chip circuits and the heat sink. By reducing the thermal resistance between the heat sink and the heat generating portions of the flip chip circuits and by placing the fan proximate to the heat sink, it is possible to air cool the active panel.

By using an air cooled approach (vs. using one of the prior art blower or liquid cooling approaches), an affordable approach to cooling an active panel is provided. Furthermore, by using a single heat sink to cool multiple flip chip mounted active circuits (vs. the prior art multiple, individual "hat sink" approach), the cost (both part cost and assembly costs) of cooling an active panel is reduced since it is not necessary to mount individual heat sinks on each flip chip circuit.

Furthermore, by arranging a fan and ducts behind each active panel, the thermal management technique described herein results in a modular, compact thermal management system. Moreover, the active panel and the thermal management system (e.g. the fan and associated duct structure) can be combined to provide a modular, integrated panel assembly (IPA) which can be used as a "building block" to form larger active phased arrays. That is, an array of such IPAs can be used to form an active phased array antenna which is air cooled. Thus, the cooling approach described herein reduces the problem of air cooling a large active panel array to the problem of cooling only a portion of a large active phased array (i.e. performing air cooling at the "building block" level). In this way, a distributed cooling technique and thermal management system for cooling an array antenna, such as a panel array, is provided. The cooling technique is distributed since a plurality of independent thermal management systems are used to cool individual portions of an array antenna. Use of the plurality of independent thermal management systems results in reduced thermal gradients across the entire array antenna. Array antennas having thermal gradients which are relatively small are generally easier to calibrate than array antennas having relatively large thermal gradients. Furthermore, use of independent thermal management systems in a distributed cooling technique such as that described herein reduces thermal interactions between the different array portions which again leads to smaller thermal gradients across a large array antenna such as a panel array. Use of a building block approach also allows manufacture of an active phased array antenna which is lower cost than prior art approaches.

Moreover, by integrating a fan with each panel, large blowers are not required and thus the amount of back-pressure generated in a large array is reduced. Thus, the thermal management system described herein can be used for air-cooling large phased arrays antennas without introducing a large amount of back-pressure.

In one embodiment, the active panels include T/R modules selected having a desired power level. Since the cooling approach described herein is modular (i.e. each IPA is provided from an active panel having a thermal management system associated with it which utilizes air cooling), the thermal management system described herein can be scaled to fit the needs of any given RF system. For example, the thermal management system can be scaled to operate with active panels having high power T/R modules or low power T/R modules. Thus, the thermal management system described herein can be scaled to be suitable for use with active panels operating over a wide range of power levels and having different physical sizes. Accordingly, the thermal management system and approach described herein can be used in a wide variety of RF systems operating over a wide range of RF output power levels. Thus, the same active panel array architecture and the same thermal management architecture can be used over a wide range of RF output power per T/R module.

In one embodiment, the flip chip circuits are provided as monolithic microwave integrated circuits (MMICs) and the heat sink heat spreading elements are provided as fins or pins.

In one embodiment, the heat sink is provided as an aluminum finned heat sink having a mechanical interface between a surface thereof and a plurality of flip-chip MMICs disposed on a surface of an active panel. Air cooling of such a heat sink and active panel eliminates the need for expensive materials (such as diamond or other graphite material) and elimination of heat pipes from the thermal management system. Thus, the thermal management system described herein provides a low cost approach to cooling active phased array antennas containing heat-generating flip chip mounted MMIC t components.

In one embodiment, the active panel is provided as a multilayer, mixed signal printed wiring board (PWB) with flip-chip attached MMICs. A single heat sink has a first surface mechanically attached to the PWB so as to make thermal contact with the back of each flip-chip MMIC. Such an active panel architecture can be used to provide active panels appropriate for use across RF power levels ranging from mW per T/R channel to W per T/R channel, over a range of different duty cycles.

As a result of being able to use a common panel architecture and thermal management architecture in systems having multiple, different, power levels and physical sizes, it is also possible to use common fabrication, assembly and packaging approaches for each of the systems. For example, both low power and high power active, electronically-scanned arrays (AESAs) can utilize common fabrication, assembly and packaging approaches. This leads to large cost savings in the manufacture of AESAs. Thus, the systems and techniques described herein can make the manufacture of AESAs more affordable.

It is desirable to minimize the number of thermal interfaces between the flip chip circuit and the heat sink. Thus, in one embodiment, direct mechanical contact is used between the flip-chip MMICs and a surface of a heat sink. In other embodiments, an intermediate "gap-pad" layer may be used between the flip-chip circuits (e.g. MMICs) and the surface of the heat sink. The gap-pad layer is typically used to ensure good thermal conductance between the heat-dissipating components and the heat sink. The gap pad layer is a grease-free, conformable elastomeric having a thermal conductivity which is relatively high compared with the thermal conductivity of thermal greases and dry interfaces. The thickness of the gap pad will typically vary between 10-20 mils, depending upon the flatness of the adjoining electrical components and the heat sink.

By integrating a fan behind each active panel in an array of active panels, an affordable, modular architecture is provided which can be used as a basic building-block with which to build active phased arrays. Utilizing the modular packaging and thermal management approach described herein allows the assembly of active phased arrays having sizes in the range of about 0.25 m$^2$ to about 36 m$^2$ while also achieving a significant reduction in thermal management complexity (i.e. by using the air-cooling approach described herein).

It should be appreciated that in prior art approaches, for every new size of active phased array, a significant engineering effort is typically required to design a thermal management system to move air over the entire active phased array.

The thermal management system described herein, on the other hand, reduces the problem of air-cooling phased arrays of various sizes to the problem of air-cooling a single active panel (e.g. a six inch (wide) by ten inch (high) by six inch (deep) unit at X-Band). It has been recognized that by being able to effectively cool a single active panel, it is possible to air-cool an entire active phased array made from a plurality of such active panels. Furthermore, a plurality of like active panels can be assembled to provide a large phased array (e.g. a large AESA) without incurring large development costs (sometimes referred to as non-recurring engineering or NRE costs) associated with analysis and design of a new thermal management system for active phased arrays.

The modular system described herein also provides performance flexibility. Desirable RF output power, noise figure, etc. of T/R channel electronics can be achieved by utilizing a wide range of surface mounted semiconductor electronics. Since the active components are mounted on an external surface of the active panel, the same panel can be used in a wide range of applications by merely mounting (e.g. as flip-chips) active circuits having different characteristics (e.g. high power or low power circuits) to the active panel. The heat sink, fan and other portions of the thermal management system can be adjusted accordingly (e.g. by selection of different fan sizes, duct sizes, or heat sink materials). The active panel thus provides design flexibility in that it is designed to accept at least the following semiconductor electronics: RF CMOS based upon commercial silicon technology and selected to provide desirable RF characteristics (e.g. lowest output power and highest noise figure); silicon germanium (SiGe) selected to provide desirable RF characteristics (e.g. RF output power levels and noise figures in the X-band frequency range); gallium arsenide (GaAs) selected to provide desirable RF characteristics such as RF output power densities and low noise figure (it should be appreciated that heretofore, AESA's at L-Band and above have been enabled by GaAs technology); as well as emerging technologies such as gallium nitride (GaN) which demonstrates relatively high power, efficiency, and power density (Watts/mm$^2$) characteristics compared with all existing semiconductor technologies.

The thermal management system described herein efficiently transfers heat (i.e. thermal energy) from an active panel (and in particular from active circuits mounted on the active panel) to a heat sink. By reducing the number of thermal interfaces between the active circuits and the heat sink, the thermal resistance, and therefore temperature rise, from the active circuits to the heat sink is minimized. The fans and ducts are configured to efficiently transfer the dissipated thermal energy away from the heat sink (and thus the active panel) and thus the thermal management system maintains the temperature of an integrated active panel assembly (IAPA) within a desired operating temperature range. Cooling individual portions of an array antenna (e.g. by cooling each of the IAPAs individually) reduces temperature gradients across the array antenna. In a preferred embodiment, the active circuits are mounted on the active panel as flip-chip circuits.

By using a modular approach to thermal management of an antenna array, a distributed cooling approach is provided. The thermal management system described herein thus provides a technique for distributed air cooling of a large antenna aperture. The thermal management technique is distributed since individual blocks of cooling systems (e.g. a plurality of blocks) are used to cool individual portions of an array antenna such as a panel array antenna. Since cooling blocks are used, the approach can be scaled to large array antennas (i.e. by simply adding more cooling blocks). Furthermore, by cooling individual portions of an array antenna (e.g. by cooling each of the active panels individually) temperature gradients across the array antenna are reduced. Thus, in this manner a distributed (vs. centralized) air cooled AESA can be provided.

BRIEF DESCRIPTION OF THE DRAWINGS

The foregoing features of this invention, as well as the invention itself, may be more fully understood from the following description of the drawings in which.

DETAILED DESCRIPTION OF THE PREFERRED EMBODIMENTS

Figure 1:
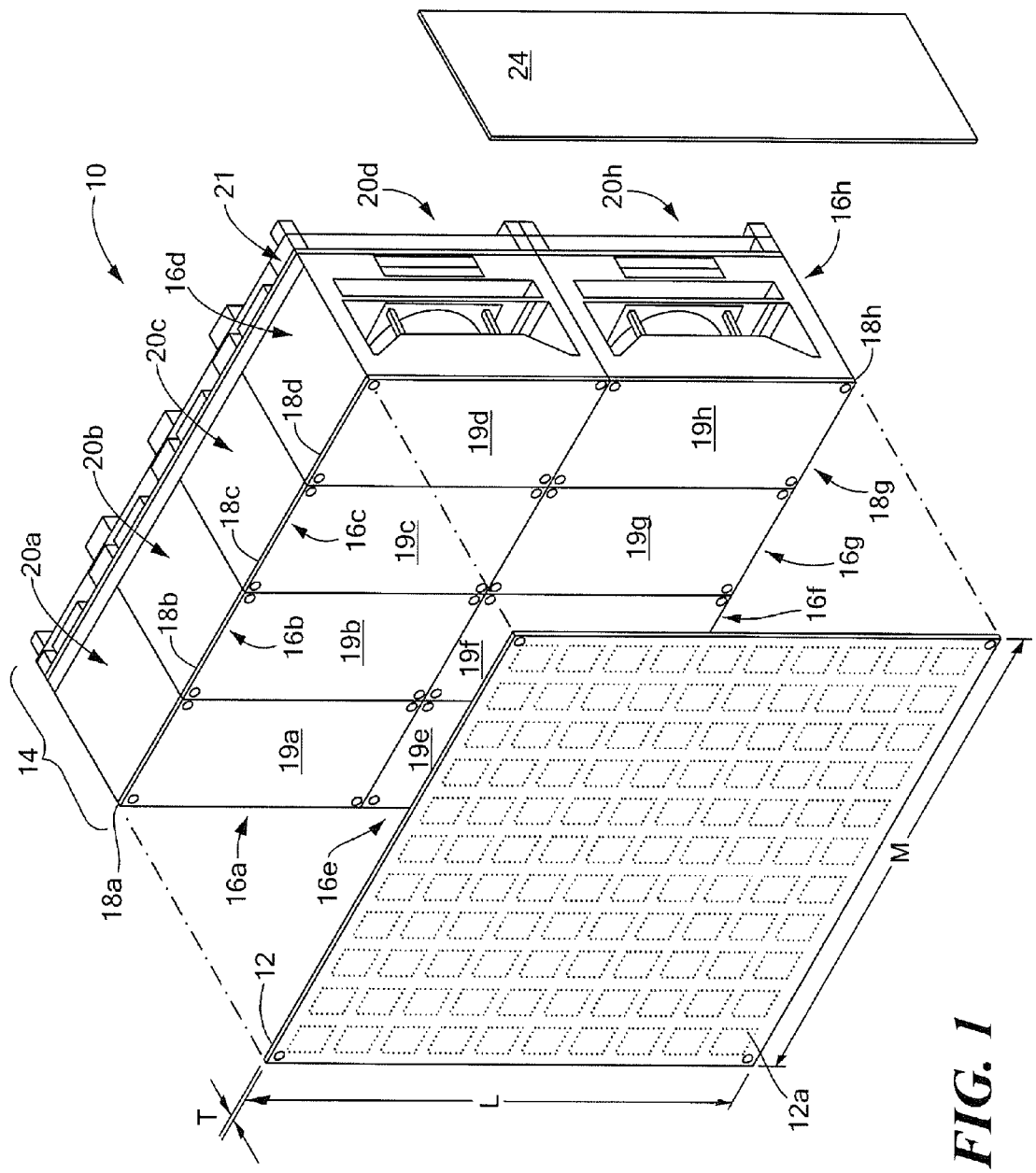
FIG. 1 is an isometric view of an active, electronically scanned array (AESA) having a panel architecture.

Referring now to FIG. 1, an exemplary active, electronically scanned array (AESA) 10 having a panel architecture is provided from an antenna panel 12 (also sometimes referred to herein as a "radiator panel") coupled to an integrated panel array assembly (IPAA) 14. Antenna panel 12 is thin and generally planar and has a plurality of antenna elements generally denoted 13, disposed to transmit and receive RF energy through a first surface 12a thereof. Antenna elements 13 are shown in phantom since they are typically below external surface 12a and thus not directly visible in FIG. 1.

In one embodiment, antennal panel 12 may be provided as a stacked patch antenna panel configured for operation in the X-band frequency range and having a thickness (T) in the range of about 0.1 inch to about 0.4 inch (with a thickness typically of about 0.2 inch being preferred) and having a width (W) of about 0.5 meters (m) and a length (L) of about 0.5 m with 1024 patch antenna elements (not all shown visible in FIG. 1).

In the exemplary embodiment of FIG. 1, IPAA 14 is provided from eight integrated active panel assemblies (IAPAs) 16a-16h. Each of the eight IAPAs 16a-16h are mechanically coupled together to form the IPAA 14. It should be appreciated that single antenna panel 12 is coupled to a single IPAA 14 and that IPAA 14 is comprised of a plurality of IAPA's 16. It should also be appreciated that in one embodiment antenna panel 12 includes only antenna elements and feed circuits (not visible) configured to electronically couple to active circuits in the IAPAs 16. This architecture (i.e. using a single substrate or antenna panel having only passive components and multiple smaller circuits, i.e. IAPAs 16 which include active circuits) results in a lower cost AESA since if an active circuit fails, only the smaller IAPA 16 in which the failed circuit resides need be replaced and the remaining structures (e.g. antenna panel 12 and other IAPAs 16) can still be used.

Each of the IAPAs 16a-16h include a corresponding one of eight active panels 18a-18h and a corresponding one of eight thermal management systems 20a-20h. Thermal management systems 20a-20h cool corresponding ones of the active panels 18a-18h. Each of active panels 18a-18h are electrically coupled to antenna panel 12 via a first surface 32 thereof. A second surface (not visible) of active panels 18a-18h have active circuits (not visible in FIG. 1) disposed thereon.

In one exemplary embodiment, the AESA 10 comprises eight IPAAs in one 0.5 meter×0.5 meter (0.5 m×0.5 m) assembly (i.e. L=0.5 m and W=0.5 m in FIG. 1). In other embodiments, fewer or more than eight IPAAs may be used to provide an AESA. Also, the AESA may be provided having sizes other than 0.5 m×0.5 m. One of ordinary skill in the art will appreciate how to select the number of IPAAs to include in an AESA as well as the length (L) and width (W) of each IAPA 16 and AESA 10 required for a particular application.

As will be described below in conjunction with FIG. 1A, each AESA 10 may be used as a sub-array (or a building block) to form a larger AESA. If each AESA is provided as a 0.5 m×0.5 m building block (i.e. each AESA corresponds to a ½ meter×½ meter block), the larger AESA can be provided having a size in the range of ½ meter square (i.e. AESA 10 in FIG. 1 forms the entire AESA) to 6 square meters (i.e. 172 EASAs form the larger AESA. Larger sizes (e.g. up to and above 36 $m^2$) are also possible.

The IAPAs 16a-16h are fastened together by a grid structure 21 disposed at a rear surface of the IAPAs 16 and by top and side access panels 22, 24 (FIG. 2) disposed across the top and bottom surfaces of the integrated panel array assembly (IPAA) 14. Since the IAPA's are mechanically independent, they are sometimes referred to herein as line replaceable units (LRUs) which indicates that if one of IAPAs 16a-16h were to fail or begin to operate incorrectly or with degraded performance, the IAPA could be removed and a new IAPA could be inserted in its place.

By appropriate selection of the active components coupled thereto, the active panels 16a-16h may be configured to provide a wide range of RF power levels and radar waveforms including short and long transmit pulses at multiple pulse repetition frequencies (PFRs). Different power levels are achieved by appropriate selection of the active components provided as part of the active panels 16a-16h. In some embodiments, MMIC technologies are preferred and can be used to provide systems which operate with relatively low power T/R channels (e.g. less that about 1 watt (W) per T/R channel). Also, flip chip attached circuits may be used in the active panels 16a-16h to provide low power per T/R Channels. Also flip chip attached SIGe or RFCMOS circuits may be used in the active panels 16a-16h to achieve medium power channels (e.g. in the range of about 1 W to about 10 W per T/R transmit channel). Also, flip chip circuits may be used in the active panels 16a-16h to provide high power channels. It should thus be appreciated that one panel architecture can handle T/R channel RF output peak power from milli-watts (mW) to tens of watts and average power from mW to watts. Thus, by populating the active panels 16a-16h with different types of active circuits (e.g. different types of flip chips), the active panels 16a-16h may be appropriate for use in different types of radar or other RF systems.

Figure 1A:
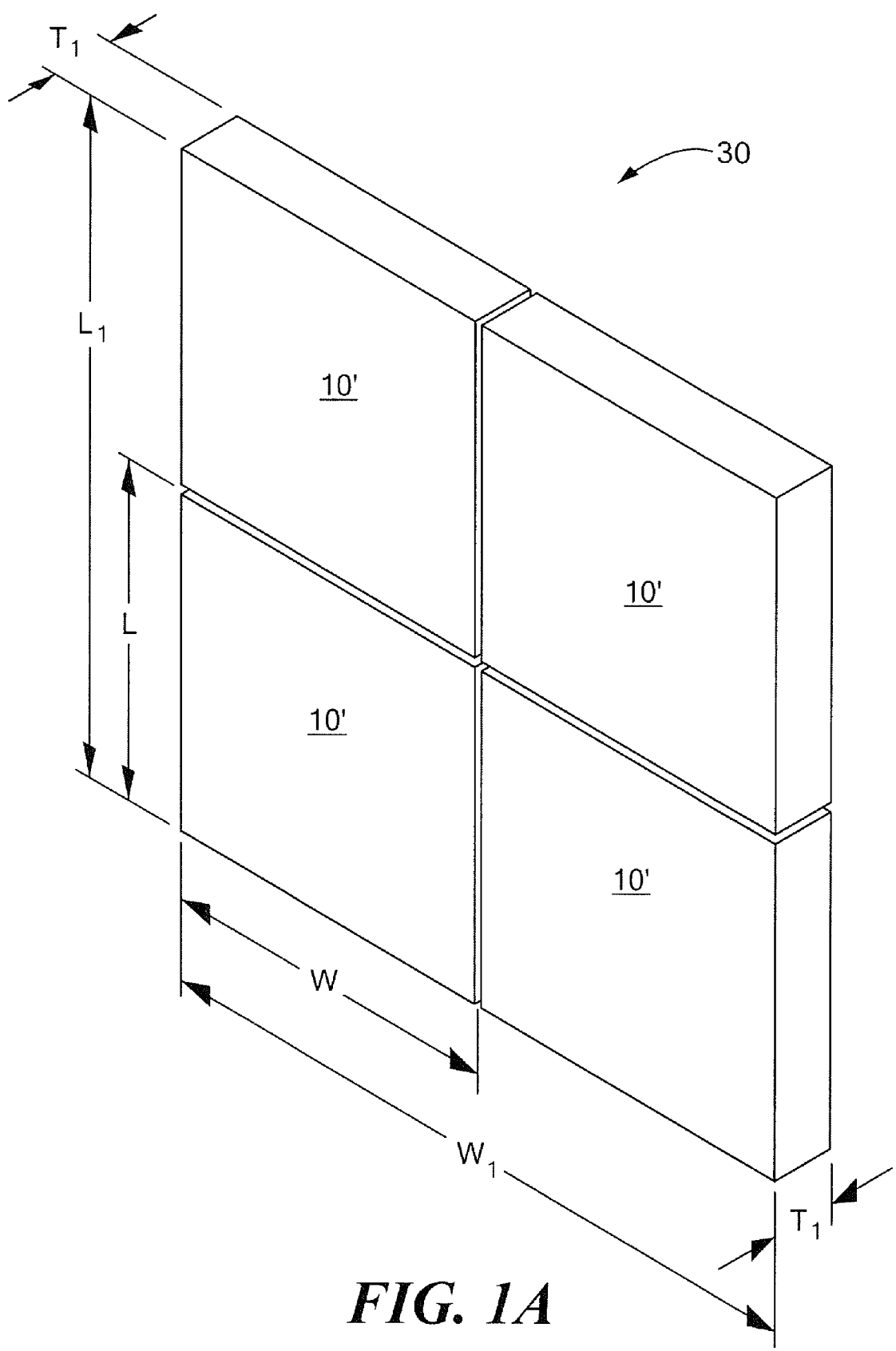
FIG. 1A is an isometric view of an AESA provided from a plurality of AESAs such as that shown in FIG. 1.

Referring briefly to FIG. 1A, an AESA 30 is formed from a plurality of AESAs 10' which may be the same as or similar to AESA 10 described above in FIG. 1. In the exemplary embodiment of FIG. 1A, AESA 30 is provided from four AESAs 10'. It should thus be appreciated that any number of AESAs 10' (e.g. fewer or more than four) can be used. It should further be appreciated that AESAs 10' can be used as building blocks to form a larger AESA (e.g. AESA 30) having any desired size and shape including but not limited to a generally rectangular shape, a generally square shape or an irregular shape.

In the case where a plurality of AESAs 10' (or AESAs 10 in FIG. 1) are combined to form a larger AESA (e.g. AESA 30), each AESA 10' is considered a sub-array of AESA 30. Also, due to the modular packaging of each AESA 10', each AESA 10' may be referred to as a so-called line replaceable units (LRU) within the AESA 30. Thus, the modular nature of AESAs 10 and 10' allows them to act as building blocks in forming a larger AESA such as AESA 30.

In the exemplary embodiment of FIG. 1A, each sub-array 10' (aka AESA 10' or LRU 10') comprises eight IPAAs in one one-half meter by one-half meter (0.5 m×0.5 m) assembly. This allows an active phased array such as AESA 30 to be sized in 0.5 m×0.5 m blocks (i.e. each LRU 10' shown in FIG. 1A may correspond to a 0.5 m×0.5 m block) and thus the AESA can be provided having a size in the range of 0.25 square meters ($m^2$) (i.e. where one AESA 30 is provided from a single building block) to 6 $m^2$ or larger (i.e. where AESA 30 is provided from twelve 0.5 m×0.5 m building blocks).

Thus, it should be appreciated that the AESA architecture described herein is modular in the sense that each IPAA 16 is modular with respect to an AESA 10 and each AESA 10 is modular with respect to a larger AESA such as AESA 30.

As will become apparent from the description herein below, each of the IAPAs 16a-16h are modular. Thus, in the event that one of the integrated active panel assemblies 16a-16h fails or has a performance degradation below an acceptable level, the module (i.e. one of the integrated active panel assemblies 16a-16h) may be removed and replaced with a like (i.e. a functionally equivalent) integrated active panel assembly. For this reason, each of the integrated active panel assemblies 16a-16h can be referred to as a line-replaceable-unit (LRU) with respect to the AESA 10.

Figure 2:
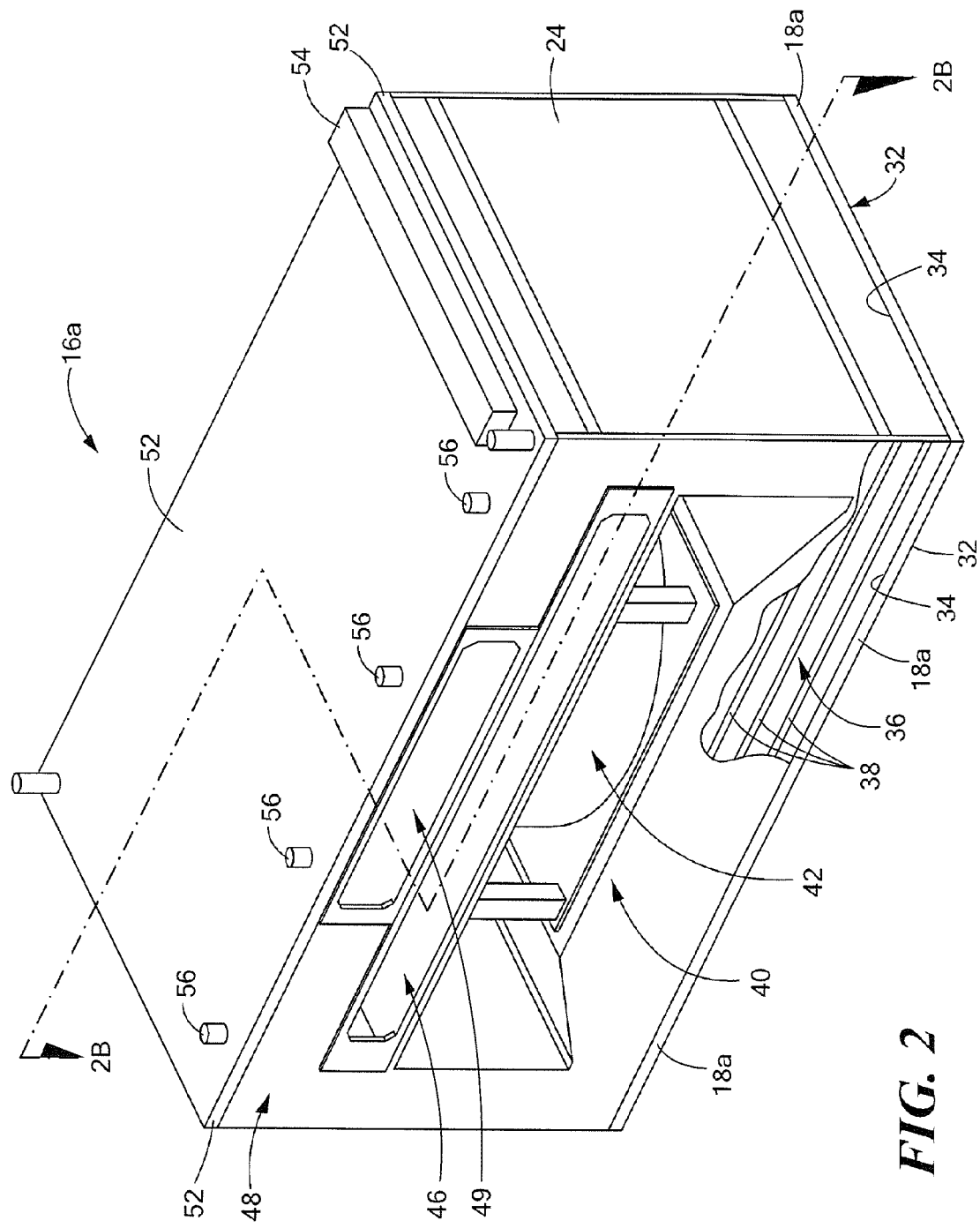
FIG. 2 is an isometric view of an integrated active panel.
Figure 2A:
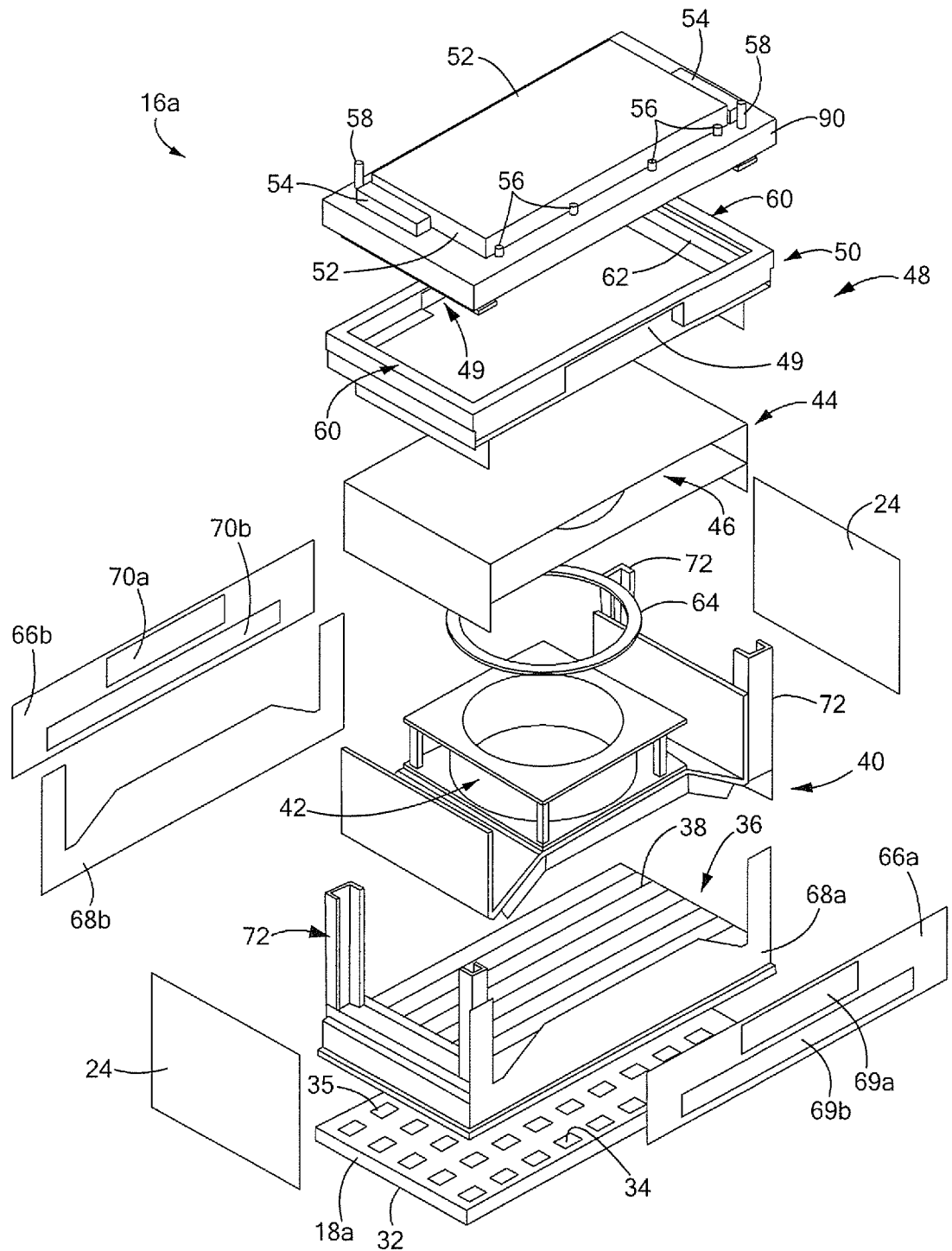
FIG. 2A is an exploded isometric view of the integrated active panel of FIG. 2.
Figure 2B:
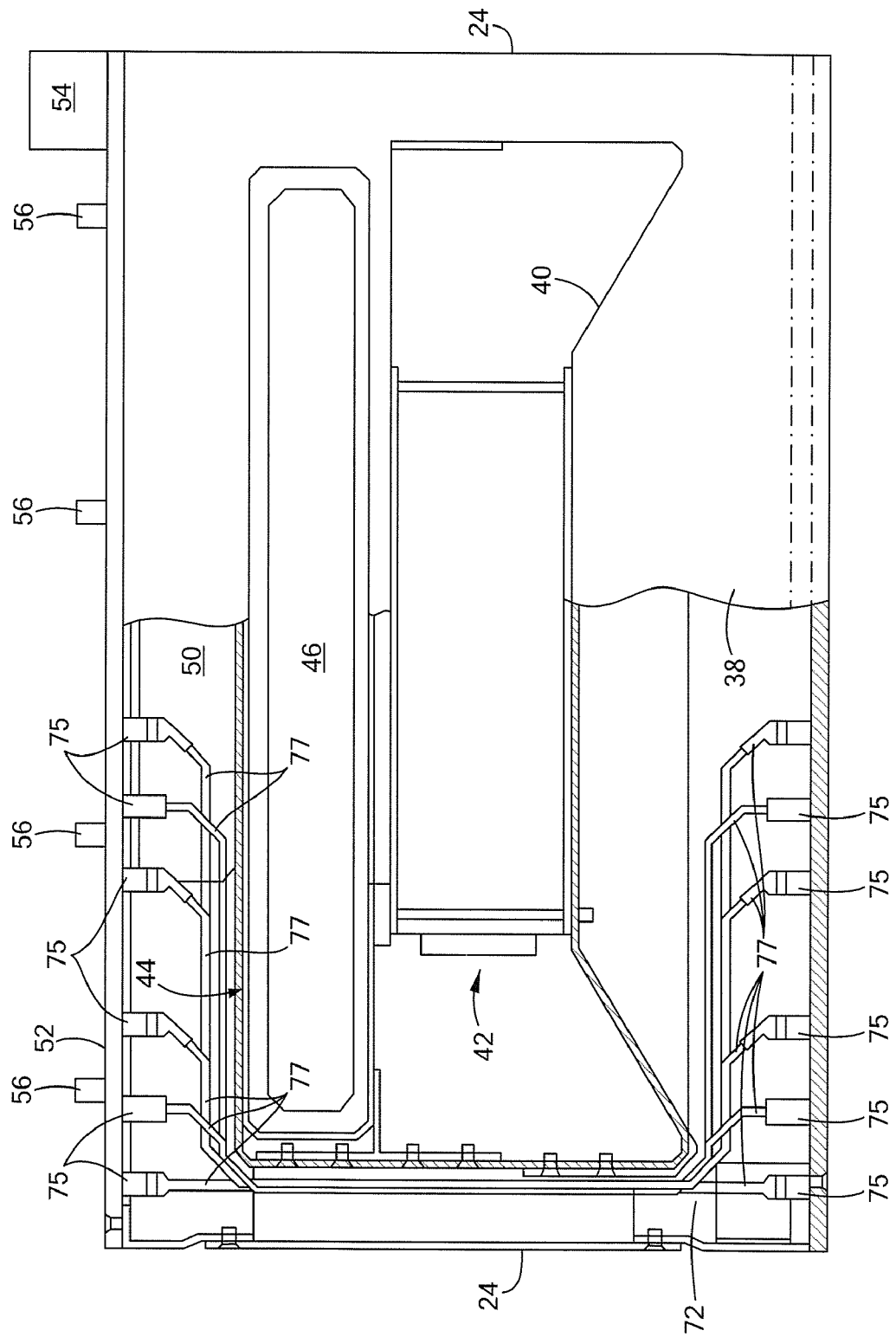
FIG. 2B is a partial cross-sectional view of the integrated active panel of FIGS. 2 and 2A taken across lines 2B-2B in FIG. 2.

Referring now to FIGS. 2-2B, in which like elements of FIG. 1 are provided having like reference designations, and taking integrated active panel assembly (IAPA) 16a as representative of integrated active panel assemblies 16b-16h, IAPA 16a includes active panel 18a. Active panel 18a has a first surface 32 configured to couple to at least a portion of an antenna panel (e.g. antenna panel 12 in FIG. 1) and a second surface 34 having a plurality of active circuits 35 disposed thereon.

In one embodiment, the active circuits 35 are mounted on surface 34 of the active panel 18a using a flip chip technique and thus the active circuits are sometimes referred to as flip chips. In one embodiment, the active panel 18a provides one hundred twenty-eight (128) transmit/receive (T/R) channels as well as a three channel monopulse beamformer (TX/Σ, ΔAz, ΔEl). The active panel 18a may also be provided having an environmental coating disposed thereon as well as optional circulators for each T/R channel.

A heat sink 36 has a first surface 36a disposed over the plurality of active circuits 35 (e.g. flip chip mounted circuits) disposed on surface 34 of panel 18a. A second surface 36b of heat sink 36 has a plurality of heat spreading elements 38 projecting therefrom. It should be appreciated that in the exemplary embodiment shown herein, heat spreading elements 38 are shown as fins having a rectangular cross-sectional shape, but those of ordinary skill in the art will appreciate that fins or pins or any other heat spreading element having any cross-sectioned shape or other types of heat spreading elements may also be used.

Disposed over the heat sink 36 is a fan mounting and supply air distribution duct 40 with a fan 42 disposed therein. Supply air distribution duct 40 is provided having a truncated triangular cross-sectional shape selected to promote air flow in a desired direction across the heat sink 36. Fan 42 is disposed to move air across the heat sink fins 38 with distribution duct 40 disposed to assist in the air movement This fan, of the tube-axial variety, has the inlet and exhaust openings in the same direction, as opposed to a blower which has the inlet and exhaust perpendicular to one another. The use of the tubeaxial fan allows sufficient flow while providing a compact packaging configuration.

A supply air duct assembly 44 having an inlet air opening 46 provided therein is disposed over fan 42. A return air duct assembly 48 comprises an exit air duct segment 50 having a pair of air exit openings 49 and one or more vertical return air ducts 72 which provide an air flow path between the finned surface of heat sink 36 and exit air duct segment 50. Exit air duct segment 50 is disposed over the supply air duct assembly 44. The supply air duct, return air duct and a plurality of distribution air ducts are configured to be in fluid communication with each other including in fluid communication with the air inlet opening 46 and the air exit opening 49. A DC power and logic signal board 52 and DC power and logic signal system connectors 54 are coupled to a heat sink 90 and disposed over return air duct assembly 48. RF connectors 56 are exposed through assembly 48 and positioning guide pins 58 project from through a surface duct assembly 48. Guide pins 58 (only two guide pins being shown for clarity) are used to align the IAPA 16a for mechanical mating with other structures and RF connectors 56 are disposed to mate with other RF components to be coupled to the IAPA 16a.

In operation, fan 42 (disposed within the air duct assembly) directs air from the air inlet opening 46 of the supply air duct through the supply air duct assembly 44 and out the air exit opening 49 of the return air duct assembly 48. The fan 42 and supply air duct are disposed to direct air over a first surface of a heat sink having the heat spreading elements 38 projecting therefrom. A second opposing surface of the heat sink is disposed over and in thermal contact with the plurality of flip chip circuits 35 disposed on the surface 34 of active panel 18a. The second opposing surface 32 of active panel 18a is configured to electrically couple to at least a portion of an antenna panel (not shown in FIGS. 2 and 2A).

Thus, the thermal management system described herein efficiently transfers heat (i.e. thermal energy) from the active panel (and in particular from active circuits 35 mounted on the active panel) to the heat sink 36. Mounting the heat sink 36 directly to the active circuits 35 reduces the number of thermal interfaces between the active circuits and the heat sink. By reducing the number of thermal interface between the active circuits and the heat sink, an efficient transfer of dissipated thermal energy from the flip chip circuits to the heat sink is achieved. For this reason, although other techniques can be used, flip-chip mounting of active circuits on the active panel is preferred. The fans and ducts are configured to rapidly transfer the thermal energy away from the heat sink (and thus the active panel) and thus the thermal management system maintains the temperature of the IAPA 16a within a desired operating temperature range.

Thus, in contrast to using large capacity blowers supplying large quantities of volumetric air flow at a high backpressure across a large phased array, the integrated active panel assembly uses a relatively small fan and duct assemblies integrated into a modular unit.

Thus, two problems to air-cooling large phased arrays (i.e. use of large blowers and the generation of large back pressure) are reduced to solving the cooling problem at the integrated panel assembly level.

Thus, one basic concept is to direct outside cooling air to the integrated fan assembly that forces the air downward and over an integrated heatsink that is in intimate thermal contact with a plurality of active circuits (e.g. T/R MMIC chip sets mounted on an external surface of an active panel using a flip chip mounting technique). Air metering plates can optionally be used to control airflow to balance airflow and pressure differentials across the array.

The very short thermal path from the active circuits to the mechanically attached heat-sink makes an efficient transition from the thermal load produced by the active circuits to the heat sink dissipation elements. Air is then directed away from the active circuits upward toward the exit air ducting segment. In one embodiment, the active circuits are provided as T/R MMIC flip chips attached to the back of a one-hundred twenty-eight T/R channel active panel. Thus, in this case there exists a very short thermal path between the backside of the T/R MMIC flip-chip circuits and the heat sink.

Referring briefly to FIG. 2A an exploded view of the IAPA 16a reveals that return air duct 48 is provided having a pair of return air entrances 60 (only one of which is visible in FIG. 2A) which lead to a pair of return air exit openings 49.

Also, return air duct assembly 48 has disposed thereon power/logic (P/L) mounting and grid mounting inserts 62 which are configured to allow DC power converters and heat sink 96 to be coupled thereto.

Also visible in FIG. 2A is fan gasket 64. When the return air duct assembly 48 is disposed over fan 42, gasket 64 helps form a seal between a surface of return air duct assembly 48 and a surface of fan 42 to thus promote a desired airflow within the IAPA 16a.

Metering plates 66a, 66b coupled to left and right side plates 68a, 68b of IAPA 16a also promote a desired air flow within the IAPA 16a. In particular, the size and shape of openings 69a, 69b, 70a, 70b in respective metering plates 66a, 66b can be selected or adjusted to promote a desired air flow.

As mentioned above, vertical return air ducts 72 provide an air flow path between the finned surface of heat sink 36 and the return air duct assembly 48. Air ducts 72 also serve as a path through which cables may be disposed to run vertically and couple signals from the active panel 18a to the RF connectors 56 and DC Power and Logic signal board and connectors 52, 54.

Referring briefly to FIG. 2B a cross-sectional view of the integrated active panel assembly 16a illustrates connectors 75 and cables 77 for routing RF, power and logic signals within the assembly 16a (e.g. from active panel 18 to _____.

Figure 3:
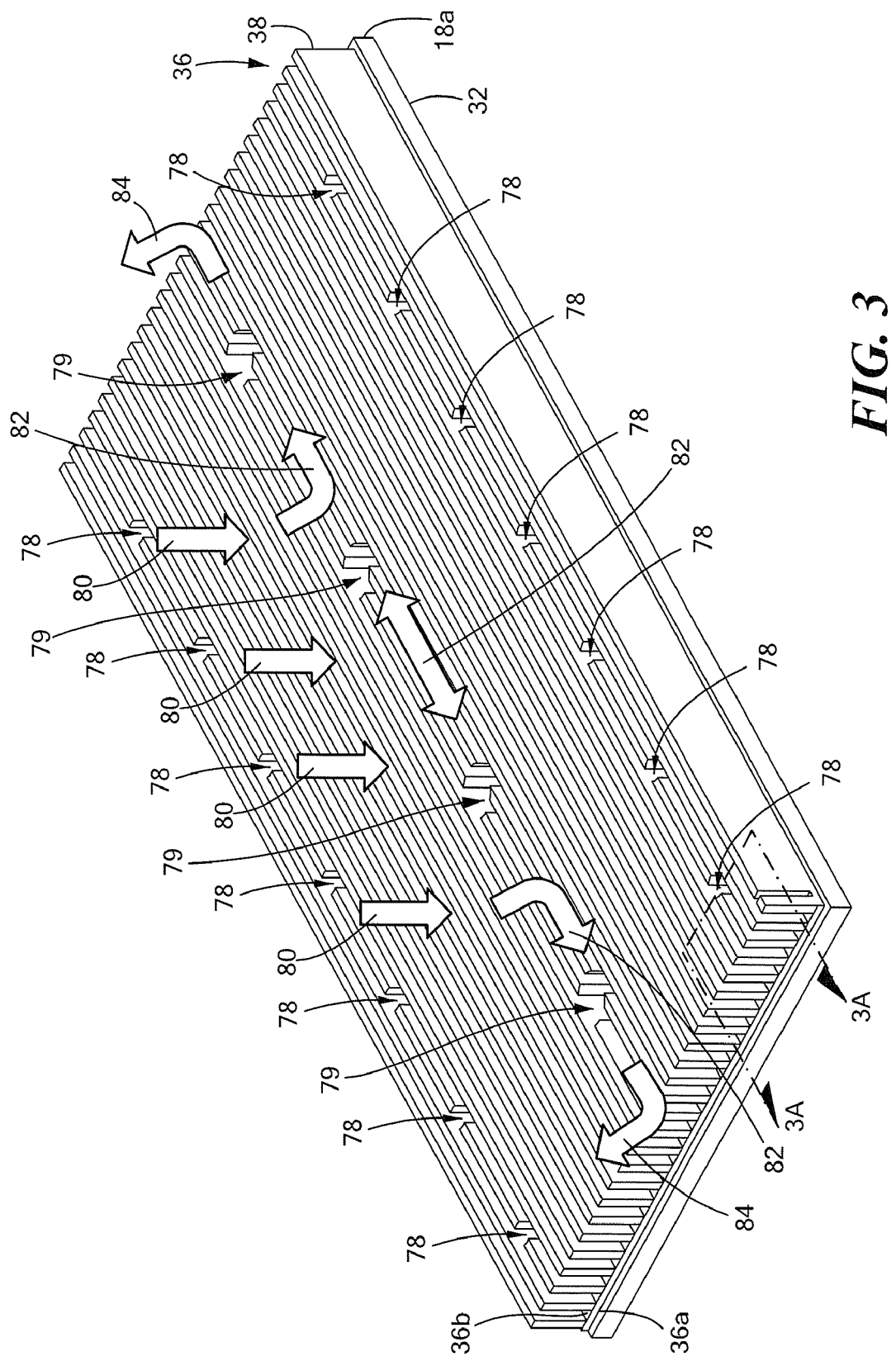
FIG. 3 is an isometric view of a heat sink coupled to an active panel.
Figure 3A:
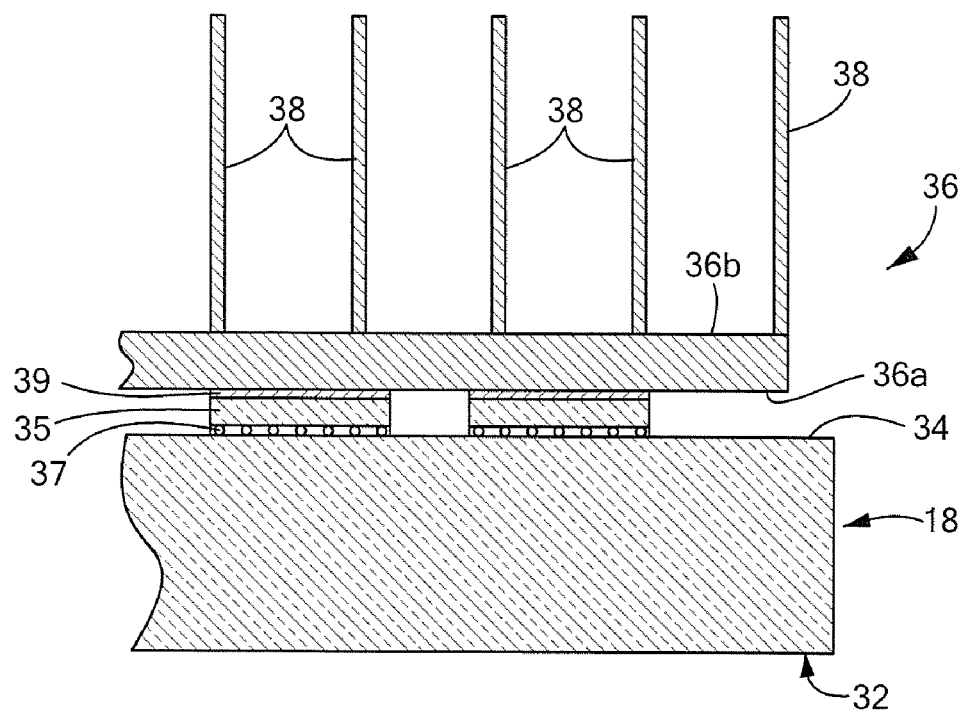
FIG. 3A is a cross-sectional view of the active panel of FIG. 3 taken along lines 3A-3A in FIG. 3.

Referring now to FIGS. 3 and 3A in which like elements are provided having like reference numerals, a heat sink 36 is disposed over active panel 18a to thus illustrate the cooling concept discussed above in conjunction with FIGS. 2-2B. It should be appreciated that the embodiment shown in FIGS. 3 and 3A does not include a gap-pad layer between surface 36a of the heat-sink 36 and the surface of active panel 18a on which flip chip circuits are disposed. Rather, a conductive epoxy bond or solder joint 39 couples heat sink surface 36a to circuits 35. It should be appreciated that other materials such as thermal grease may also be used to provide interface 39.

Heat sink 36 is provided having one or more openings 78 through which DC P/L and signal lines (e.g. some of signal connectors cables 75 and 77 shown in FIG. 2B) may be disposed to couple to appropriate portions of panel 18a. Heat sink 36 is also provided having one or more openings 79 through which RF transmission lines (e.g. one of RF connectors 75 cables 77 shown in FIG. 2B) may be disposed to couple to appropriate portions of panel 18a.

As may be most clearly seen in FIG. 3A, active panel 18a is provided having a plurality of circuits 35 flip chip mounted on an external surface thereof. In one embodiment, the flip chips 35 are soldered via a ball grid array (BGA) 37 to surface 34 of active panel 18a (e.g. using a solder re-flow operation). The active panel mounted flip-chip circuits may be provided as MMICs which make mechanical contact with a surface 36a of heat sink 36. In one embodiment, the flip chip circuits are coupled to heat sink 36 via a solder joint 39 which provides preferred thermal performance. Alternatively, the flip chip circuits 35 may be coupled to heat sink 36 via a conductive epoxy bond.

Mounting the plurality of flip chip circuits on an external surface of active panel 18a allows mounting of the single heat sink 36 directly on the flip chip mounted circuits. Thus, a very short thermal path exists from the backside of the flip-chip mounted circuits to the heat-sink surface 36a. Consequently, this configuration of active panel-flip chips-heat sink results in an efficient thermal coupling of a thermal load produced by active panel (and in particular produced by the flip-chips circuits) and the heat sink 36.

Figure 3B:
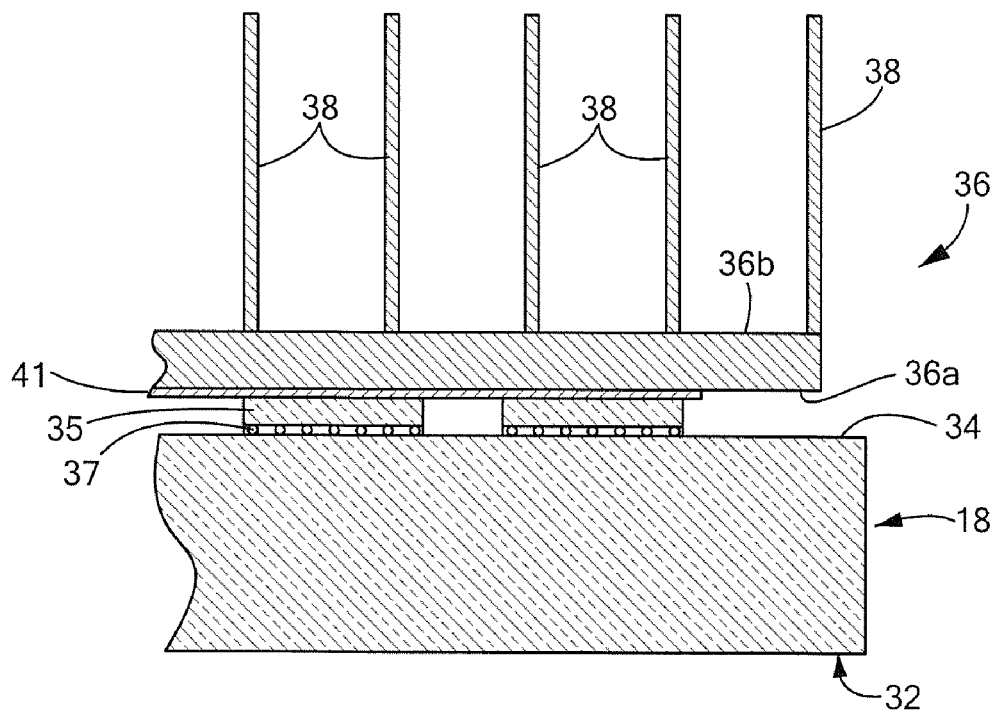
FIG. 3B is a cross-sectional view of an alternate embodiment of an active panel such as that shown in FIG. 3.

Referring briefly to FIG. 3B in which like elements of FIG. 3A are provided having like reference designations, a gap pad 41 is disposed between flip chip mounted circuits 35 and heat sink 36. When a gap pad is used, mechanical means (e.g. fasteners) may be used to secure the heat sink 36 to the backs of the flip chip mounted circuits 35. Use of gap pad 41 thus promotes ease of assembly and also allows the heatsink 36 to be removed (and thus facilitates re-work) but reduces thermal performance compared with the thermal performance of the solder connection 39 or conductive epoxy bond. Accordingly, a trade-off between thermal performance and ease of assembly and re-work can be made in deciding how best to couple the flip chip mounted circuits 35 to the heat sink 36 in any particular application.

Figure 4:
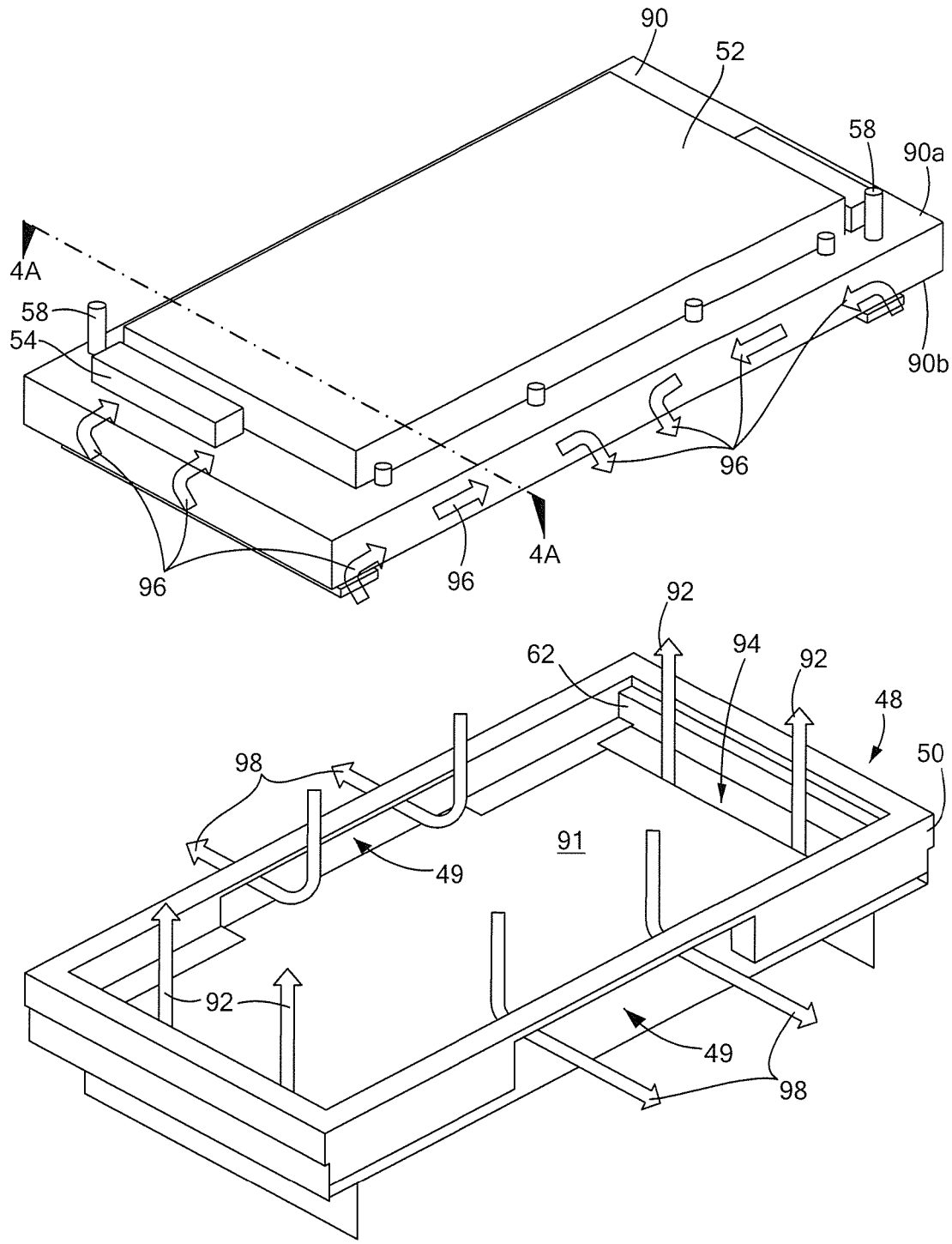
FIG. 4 is an exploded isometric view of a portion of the integrated active panel shown in FIG. 2.
Figure 4A:
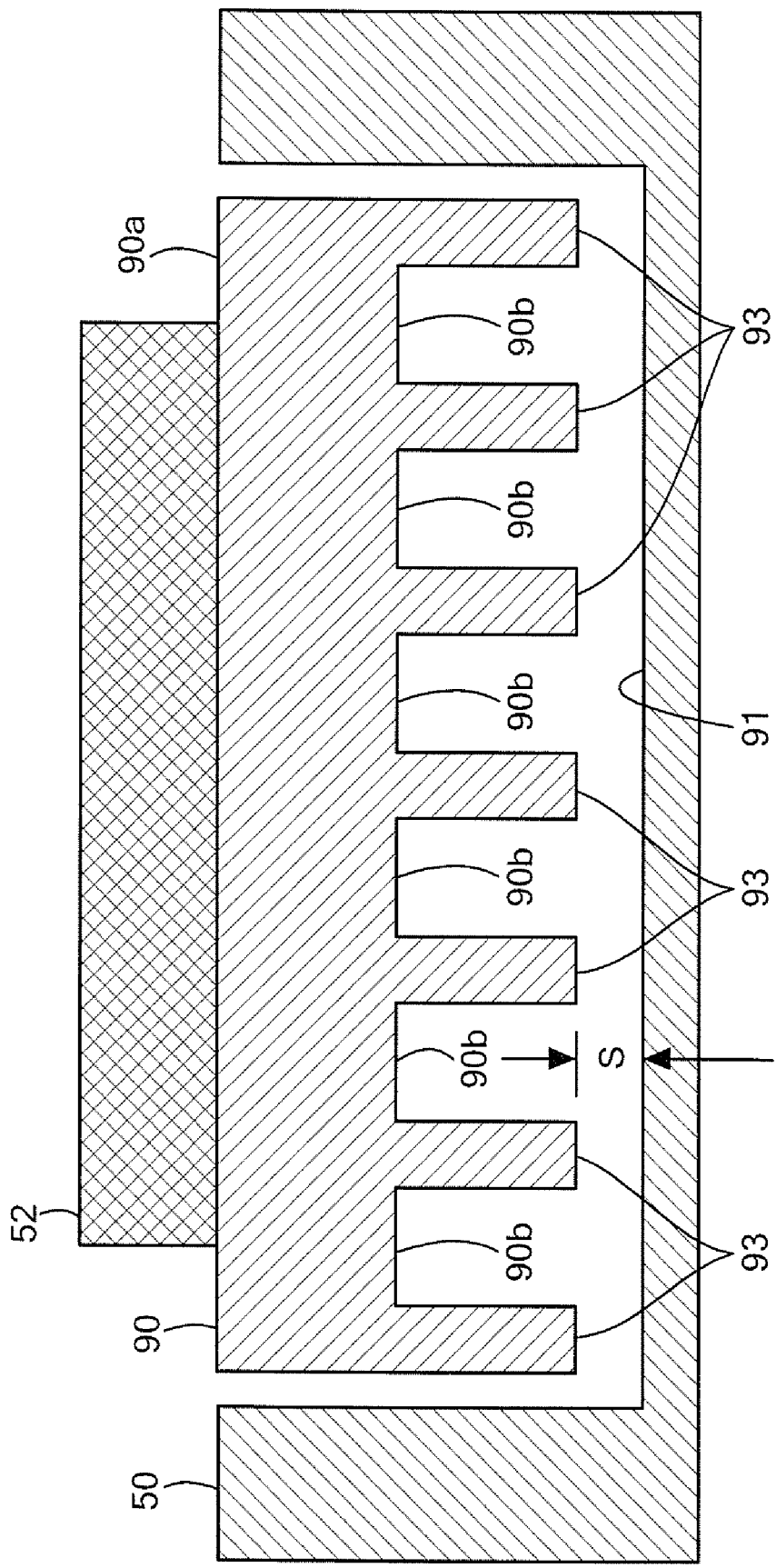
FIG. 4A is a cross-sectional view of the portion of the integrated active panel shown in FIG. 4 taken across lines 4A-4A.

Referring now to FIG. 4 a heat-sink 90 has DC power and logic signal board 52 coupled to a first (or top) surface 90a thereof and a plurality of heat spreading elements 93 (e.g. pins, fins or the like) projecting from a second (or bottom) surface 90b thereof (heat spreading elements 93 are visible in FIG. 4A). In one embodiment, a pair of DC/DC converters or other types of circuits may be coupled to surface 90b of heat sink 90.

Heat sink 90 is disposed over return air duct assembly 48 and in particular over air exit duct segment 50. Air directed across heat sink 36 (FIG. 3) travels in vertical return air ducts 72 (FIG. 2A). As indicated by reference numerals 92 in FIG. 4, air is directed from the vertical return air ducts through air return ports 94 and is directed toward heat sink 90 and then flows in a direction 96 across the heat sink heat spreading elements (not visible) of heat sink 90 and then flows in a direction 98 toward exit air duct segment 50 and eventually through air exit openings 49 thereby directing thermal energy away from the IAPA 16a. Thus, once air travels across heat sink 36 (FIG. 2A) air then travels across the second surface of heat sink 90 before it is exhausted out exit air openings 49 where it may be provided to an array level air manifold system (not shown in FIG. 4) such as that described in conjunction with FIGS. 6 and 6A.

Referring briefly to FIG. 4A, the spacing S between the bottom of heat spreading elements 93 and surface 91 of air exit duct segment 50 is selected with a trade-off between thermal performance and back pressure created in the IAPA 16a.

Figure 5:
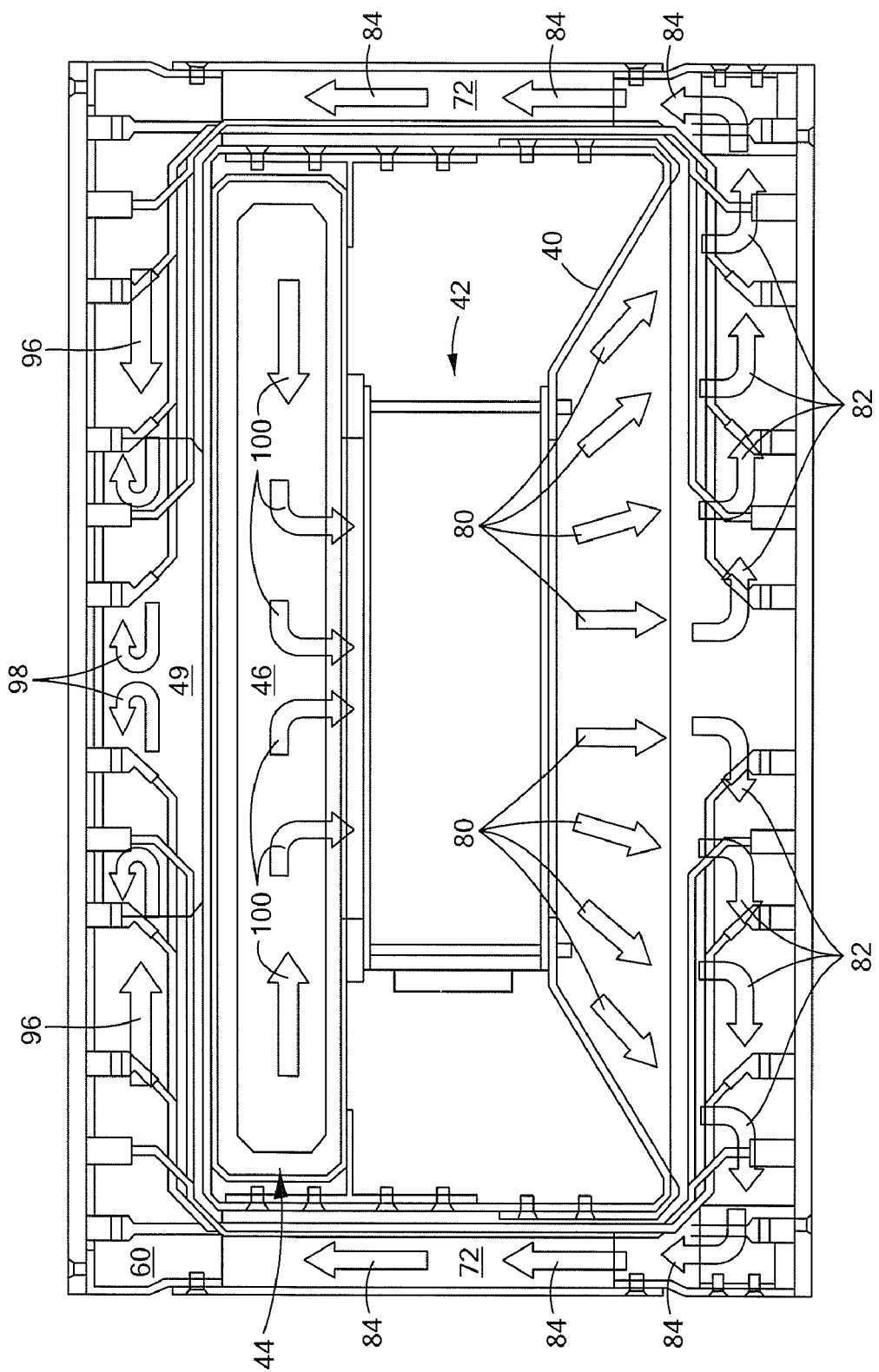
FIG. 5 is a cross-sectional view of an integrated active panel which illustrates air-flow paths through the integrated active panel.

Referring now to FIG. 5 in which like elements of FIG. 3 are provided having like reference designations, air-flow paths through an IAPA 16a to provide air-cooling of the IAPA are shown. As indicated by reference numerals 100, air enters the IAPA 16a through inlet air opening 46 in supply duct assembly 44 (FIG. 2A).

As indicated by reference numerals 80, fan 42 directs air toward the heat sink 36 and air then flows in a direction 82 across the heat sink heat spreading elements 38. Air then flows in a direction 84 upward (e.g. through vertical return air ducts 72 in FIG. 2A). As indicated by reference numerals 96 air is then directed across heat sink 90. As indicated by reference numeral 98, after passing across heat sink 90, air is directed toward the exit air ducting segment (e.g. exit air duct segment 50 in FIG. 2A) and eventually air moves out air exit opening 49 thereby directing thermal energy away from the IAPA 16a.

Figure 6:
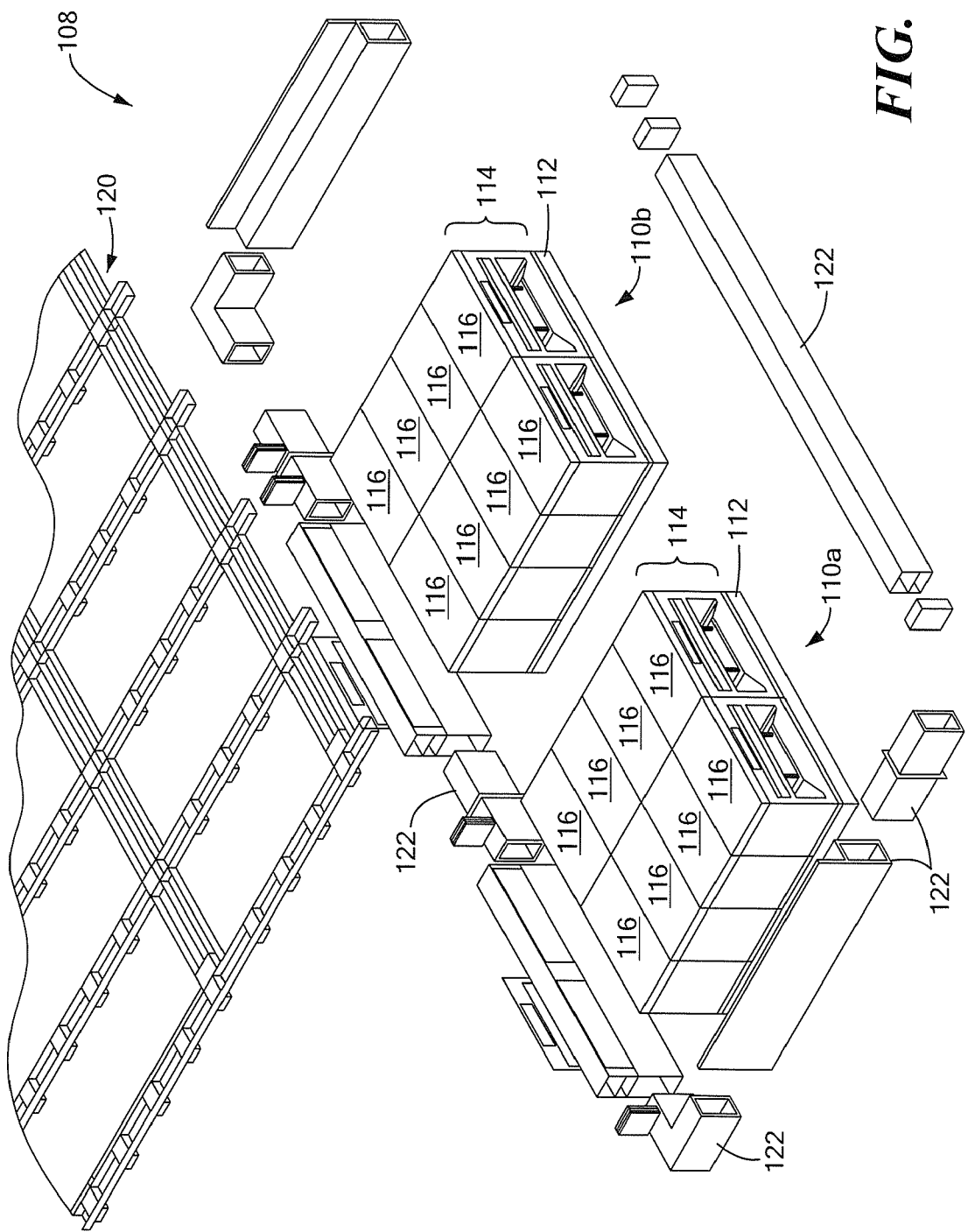
FIGS. 6 and 6A are exploded isometric views of an AESA provided from a plurality of building block integrated active panel assemblies.
Figure 6A:
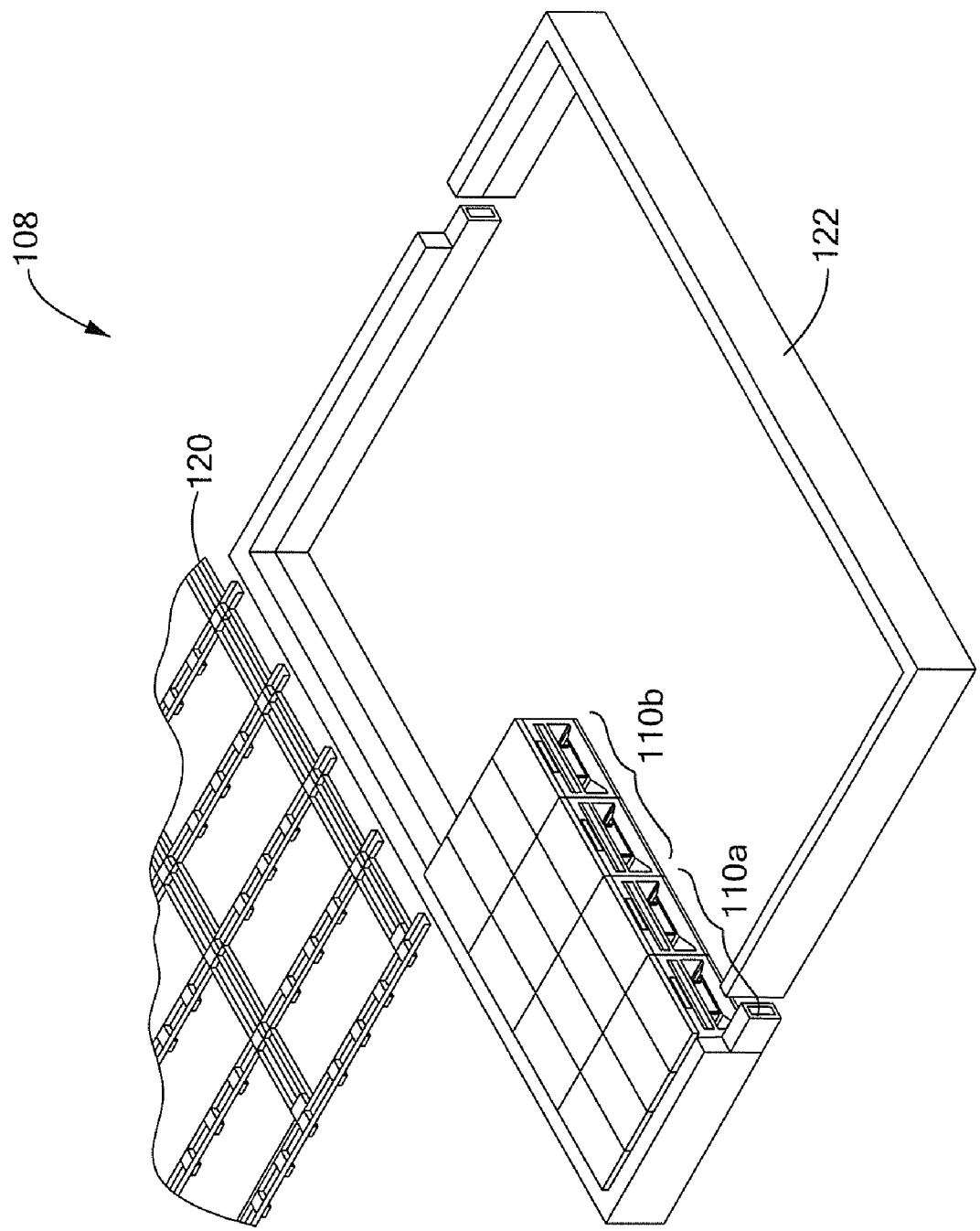

Referring now to FIGS. 6 and 6A in which like elements are provided having like reference designations, a portion of an AESA 108 provided using the modular integrated panel architecture described herein includes a plurality of sub-arrays 110 with only sub-arrays 110a, 110b shown. The sub-arrays 110 may be the same as or similar to sub-arrays 10 described above in conjunction with FIGS. 1-5. Sub-arrays 110 each include an antenna panel 112 disposed over and coupled to an integrated panel array assembly (IPAA) 114. The IPAAs 114 may be the same as or similar to IPAA 14 described above in conjunction with FIGS. 1-5. Each IPAA 114 is provided from eight integrated active panel assemblies 116 which may be the same as or similar to IAPAs 16 described above in conjunction with FIGS. 1-5. Thus, in the embodiment of FIG. 6, each sub-array 110 corresponds to an LRU of AESA 108 and each IPAA 114 corresponds to an LRU of a sub-array 110 and each IAPA 116 corresponds to an LRU of an IPAA 114. In one embodiment the sub-array LRUs 110 are provided having a length and height of 0.5 meter (i.e. the LRUs are provided as 0.5 meter×0.5 meter LRU's).

A skeletal, mechanical frame 120 ties together the LRU's 110, 112, 114, 116 using fasteners or any other technique well-known to those of ordinary skill in the art. Frame 120 also supports an air-manifold system 122 which provides an air supply/return for each row in the AESA 108. Thus, FIGS. 6, 6A illustrate the concept of building up a relatively large active phased array (i.e. active phased array 108) from a plurality of smaller subarrays (i.e. subarrays 110).

In view of the above, it is submitted that that scope of the patent should not be limited to the described embodiments, but rather should be limited only by the spirit and scope of the following claims.

What is claimed is:

1. An integrated panel array assembly (IPAA) comprising:
   (a) an active panel having first and second opposing surfaces, said active panel having a length and a width;
   (b) a plurality of active circuits mounted as flip chip circuits on the second surface of said an active panel;
   (c) a thermal management system, said thermal management system having a length which is no greater than the length of said active panel and having a width which is no greater than the width of said active panel, said thermal management system comprising:
      (1) a heat sink having first and second opposing surfaces with the first surface of said heat sink disposed on and in thermal contact with said the flip chip circuits;
      (2) a supply air distribution duct disposed over the second surface of said heat sink;
      (3) a fan disposed over said supply air distribution duct, said fan configured to direct air through said supply air distribution duct and toward the second surface of said heat sink;
      (4) a return air duct assembly in fluid communication with said supply air distribution duct; and
      (5) an exit air ducting segment in fluid communication with said return air duct assembly.

2. The integrated panel assembly of claim 1 further comprising a second heat sink disposed on a first surface of said return air duct assembly such that air traversing said return air duct assembly and exiting said exit air ducting segment passes across at least a portion of said second heat sink.

3. The integrated panel assembly of claim 2 wherein said supply air distribution duct includes an air inlet and said exit air ducting segment is disposed above the air inlet in said supply air distribution duct.

4. The integrated panel assembly of claim 3 further comprising a fan gasket disposed between a first surface of said fan and a first surface of said supply air distribution duct.

5. The integrated panel assembly of claim 1 wherein said return air duct assembly is disposed above said supply air distribution duct assembly.

6. The integrated panel assembly of claim 2 further comprising a heat generating circuit disposed over said second heat sink.

7. The integrated panel assembly of claim 6 wherein said heat generating circuit comprises a DC power converter.

8. A phased array comprising:
an antenna panel having a plurality of antenna elements disposed on a first surface thereof and having a second opposing surface;
a plurality of integrated panel array assemblies (IPAAs), each of said IPAAs having an integrated thermal management system and each of said IPAAs having an RF signal distribution circuit, a power signal distribution circuit and a logic signal distribution circuit;
a mechanical frame;
an air-manifold system mechanically coupled to said mechanical frame and in fluid communication with each of said plurality of integrated panel array assemblies (IPAAs).

9. The phased array of claim 8 wherein each of said integrated panel array assemblies (IPAAs) comprise a plurality of integrated active panel assemblies.

10. The phased array of claim 9 wherein each of said integrated active panel assemblies (IAPAs) comprises:
an active panel having first and second opposing surfaces;
a plurality of active circuits mounted as flip chip circuits on the second surface of said an active panel;
a heat sink having first and second opposing surfaces with the first surface of said heat sink disposed on and in thermal contact with said the flip chip circuits;
a supply air distribution duct disposed over the second surface of said heat sink;
a fan disposed over said supply air distribution duct, said fan configured to direct air through said supply air distribution duct and toward the second surface of said heat sink;
a return air duct assembly in fluid communication with said supply air distribution duct; and
an exit air ducting segment in fluid communication with said return air duct assembly.

11. The integrated panel assembly of claim 10 wherein said supply air distribution duct includes an air inlet and said exit air ducting segment is disposed above the air inlet in said supply air distribution duct.

12. A thermal management system comprising:
(a) an air duct assembly comprising:
a supply air duct having an air inlet opening;
a return air duct having an air exit opening; and
a plurality of distribution air ducts configured to be in fluid communication with the air inlet opening of the supply air duct and configured to be in communication with the air exit opening of the return air duct;
(c) a heat sink having a first surface configured to contact a plurality of heat generating elements and a second surface having heat spreading elements projecting therefrom;
(b) a fan disposed within the air duct assembly to direct air from the air inlet opening of the supply air duct through the supply air duct and out the air exit opening of the return air duct wherein said fan and supply duct are disposed to direct air over the heat spreading elements projecting from the second surface of said heat sink.

13. The thermal management system of claim 12 wherein said supply air distribution duct includes an air inlet and said exit air ducting segment is disposed above the air inlet in said supply air distribution duct.

14. The thermal management system of claim 12 wherein said return air duct assembly is disposed above said supply air distribution duct assembly.

15. The thermal management system of claim 1 further comprising a second heat sink disposed on a first surface of said return air duct assembly such that air traversing said return air duct assembly and exiting said exit air ducting segment passes across at least a portion of said second heat sink.

16. An apparatus, comprising:
an active panel which is thin and generally planar and which has a plurality of active circuits mounted on a first surface thereof as flip chip circuits;
an antenna panel which is disposed on second, opposite surface of said active panel, and which includes a plurality of antenna elements that are each electrically coupled to said active panel; and
a thermal management system which is coupled to said active panel on a side thereof opposite from said antenna section and which is directly thermally coupled to said active circuits.

17. An apparatus according to claim 16, wherein said thermal management system includes a sink which has a surface thereof adjacent said active circuits.

18. An apparatus according to claim 17, wherein said active panel has a plurality of electrical conductors electrically coupled to said plurality of circuits; wherein said thermal management system further comprises a fan mounting and supply air distribution duct assembly disposed over said heat sink, said distribution duct assembly having a cross-sectional shape corresponding to a truncated triangular shape and which includes an arrangement which is co-operable with said circuit board to hermetically seal said electronic components within said module, said arrangement including a frame sealingly coupled to said circuit board and extending around said electronic components thereon, and including a lid sealingly coupled to a side of said frame opposite from said circuit board; and wherein said first portion of said module includes a wall portion of said frame that has a plurality of conductors electrically coupled to said interconnection section and includes conductive elements which each electrically couple a respective one of said conductors of said wall portion to a respective one of said conductors of said circuit board.

19. An apparatus according to claim 18, wherein said active panel is provided as a multi-layer printed circuit board, and wherein said first surface of said active panel includes a plurality of connection elements which are each electrically coupled to a respective active circuit disposed thereon.

20. An apparatus according to claim 16, wherein said interconnection section includes a further circuit board, and wherein said first portion includes said module having at an end thereof adjacent said circuit board a plurality of connection elements which are each soldered to said further circuit board.

21. An apparatus according to claim 16, including a plurality of further modules which are each disposed between said interconnection section and said cooling section, which each have electronic components thereon, which each include a first portion operative to electrically couple said electronic components thereon to said interconnection section, and which each include a second portion operative to transfer to said cooling section the heat emitted by said electronic components thereon.

22. An apparatus according to claim 21, wherein said modules are spaced a substantial distance from each other.

23. An apparatus according to claim 16, wherein said electronic components include circuitry which causes said antenna section to function in a multi-beam mode that includes use by said antenna section of at least four separate beams.

24. An apparatus according to claim 23, wherein said electronic components include one of an RF circulator and an RF isolator.

25. An apparatus according to claim 24, wherein said antenna section can both send and receive electromagnetic signals through said antenna elements, and wherein said electronic components include monolithic microwave integrated circuits.

26. An apparatus according to claim 23, wherein said electronic components include a plurality of parts which are each one of an RF circulator and an RF isolator, and which are each associated with a respective one of said beams.

27. An apparatus according to claim 16, including an annular housing which extends between and is coupled to each of said interconnection section and said cooling section, said module being disposed within said housing.

28. An apparatus according to claim 27, wherein said housing is made of a material having a low coefficient of thermal expansion.

29. An apparatus according to claim 16, wherein said interconnection section includes a multi-layer circuit board.

30. An apparatus according to claim 29, wherein said antenna elements of said antenna section are patch antenna elements formed directly on said multi-layer circuit board.

31. An apparatus according to claim 29, wherein said multi-layer circuit board has at least one connector for radio frequency signals, control signals, and power.

32. An apparatus according to claim 16, wherein said cooling section includes a thermally conductive member cooperable with said second portion, and includes a phase change material disposed on a side of said thermally conductive member opposite from said second portion of said module.

33. A method of operating an antenna system which includes a thin and generally planar antenna panel having first and second opposing surface and having a plurality of antenna elements disposed to emit and receive radio frequency signals through a first one of the first and second surfaces and a plurality of active panels electrically coupled to the antenna panel, the method comprising the steps of:
transmitting electrical signals between each of the plurality of active panels and the antenna panel; and
transferring, via a thermal management system, heat emitted by the active circuits on each of the plurality of active panels such that each thermal management system cools a portion of the antenna system such that cooling the antenna system is accomplished via a distributed air cooling process to cool the active panel.

34. A method according to claim 33, wherein transferring, via a thermal management system, heat emitted by the active circuits comprises operating a plurality of fans to move air across a like plurality of active panels such that each of the plurality of fans cools the portion of the antenna system provided of which the active panel is a part.

\* \* \* \* \*

UNITED STATES PATENT AND TRADEMARK OFFICE
CERTIFICATE OF CORRECTION

| | | |
|---|---|---|
| PATENT NO. | : 7,859,835 B2 | |
| APPLICATION NO. | : 12/482061 | |
| DATED | : December 28, 2010 | |
| INVENTOR(S) | : Angelo M. Puzella et al. | |

It is certified that error appears in the above-identified patent and that said Letters Patent is hereby corrected as shown below:

Front page, (73) Assignee: delete "Allegro Microsystems, Inc., Worcester, MA (US) and replace with --Raytheon Company, Waltham, MA (US)--

Signed and Sealed this
Fifth Day of July, 2011

David J. Kappos
*Director of the United States Patent and Trademark Office*